Patented Sept. 12, 1967

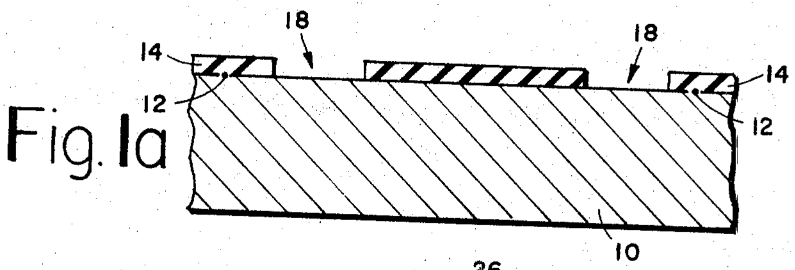
Fig. Ia
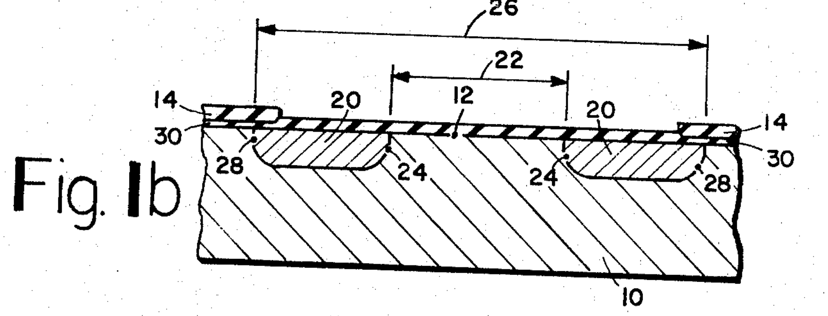
Fig. Ib
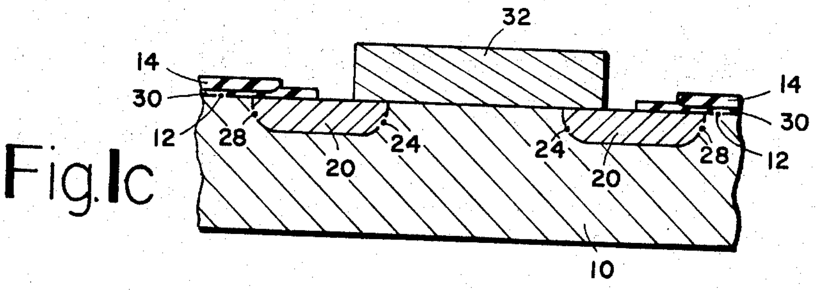
Fig. Ic
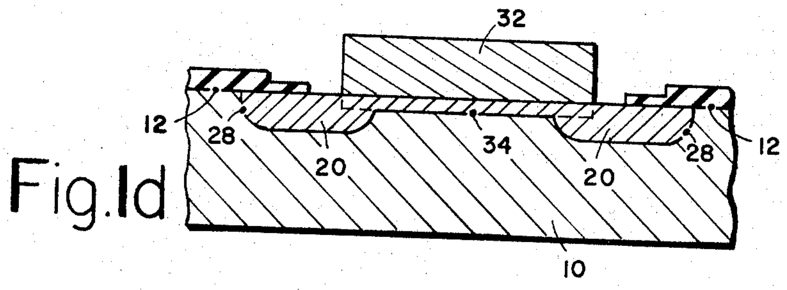
Fig. Id
HENRY A. WACKER
INVENTOR.
BY Roger S. Borovoy
ATTORNEY HENRY A. WACKER
INVENTOR.
BY Roger L. Borovoy
ATTORNEY HENRY A. WACKER
INVENTOR.
BY Roger S. Borovoy
ATTORNEY United States Patent Office 3,341,377

3,341,377

SURFACE-PASSIVATED ALLOY SEMICONDUCTOR DEVICES AND METHOD FOR PRODUCING THE SAME

Henry A. Wacker, Cupertino, Calif., assignor to Fairchild Camera and Instrument Corporation, Syosset, N.Y., a corporation of Delaware Filed Oct. 16, 1964, Ser. No. 404,352
9 Claims. (Cl. 148—177)

ABSTRACT OF THE DISCLOSURE

This invention relates to a surface-passivated semiconductor device having a junction extending to the semiconductor surface, protected by a passivating insulating layer. The junction is a combination of a diffused junction and a junction formed by the alloying of a dopant material into the semiconductor wafer. The diffused junction and the alloy junction together form a single passivated junction extending to the surface beneath the passivating layer.

Figure 2A:
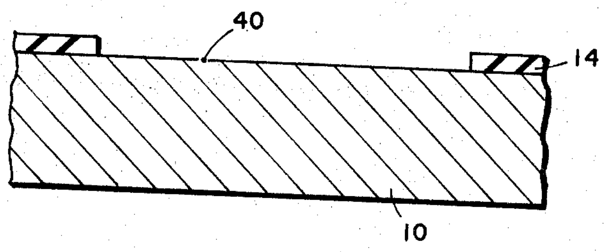
Figure 2B:
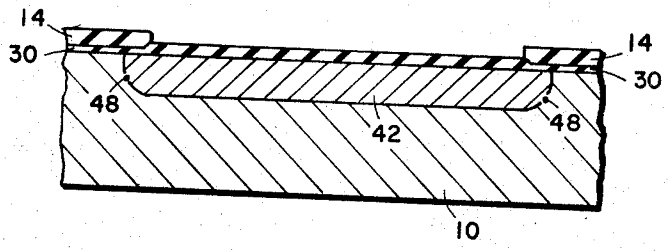
Figure 2C:
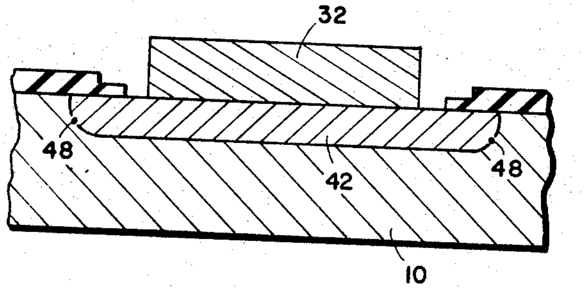
Figure 2D:
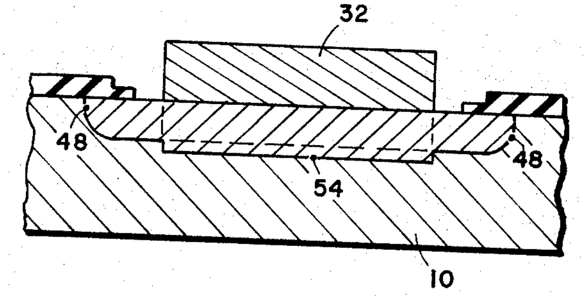

This invention relates to a solid state device and a method of forming such a device by a combination of planar diffusion and alloy techniques.

Certain solid state devices, such as tunnel diodes and reverse voltage breakdown diodes having breakdown voltages less than 4 volts, are advantageously formed by the well known alloy process. Such devices cannot readily be made by the planar diffusion process. The alloy process commonly results in a device having a step junction, or one having a large concentration gradient across the junction which is desirable in the above-mentioned devices, as well as other devices.

One of the main shortcomings in the formation of such alloy devices is their low reliability relative to the planar process. One cause of this unreliability is that the formed alloy junction is exposed to the environment during processing. The exposure during processing may cause contamination of the junction, scratches, or other defects that result in subsequent failure during extended use. Only after completion of the junction is a protective coating sometimes added. In addition to reliability, the planar process, as compared to the alloy process, provides flexibility with complex geometries and improved yields, to mention a few advantages.

This invention provides a device wherein the junction is never exposed to the environment and may have a concentration gradient heretofore unattainable by diffusion techniques alone. The finished device is more reliable than the usual alloy device and is completely compatible with existing planar techniques. The alloy junction is formed by the cooperation of a planar diffusion step and an alloy step. The planar step, in addition to providing environmental protection and its other usual advantages, enables the alloy junction to be formed completely beneath the surface of the device. From this it can be seen that an alloyed-diffused device and process has been invented having many of the advantages of both these devices and processes.

Briefly, the method of this invention comprises diffusing a region of one conductivity type into a monocrystalline semiconductor body of the opposite conductivity type and having a surface, with a junction therebetween extending to the surface of the body; forming a protective coating over the junction, which coating exposes a portion of the diffused region; and then alloying the exposed diffused portion with a material having the same conductivity type, resulting in an alloy junction below the surface of the body.

The device of this invention is a semiconductor device comprising a body of monocrystalline semiconductor material of a first conductivity type having a surface, a diffused region of the opposite conductivity type within the body, forming a PN junction therewith extending to the surface, a protective coating over at least a portion of the PN junction where same extends to the surface, and an alloy material of the opposite conductivity type dissolved partly in the body and partly in the diffused region to form an alloy junction with the material of the body.

Figure 3:
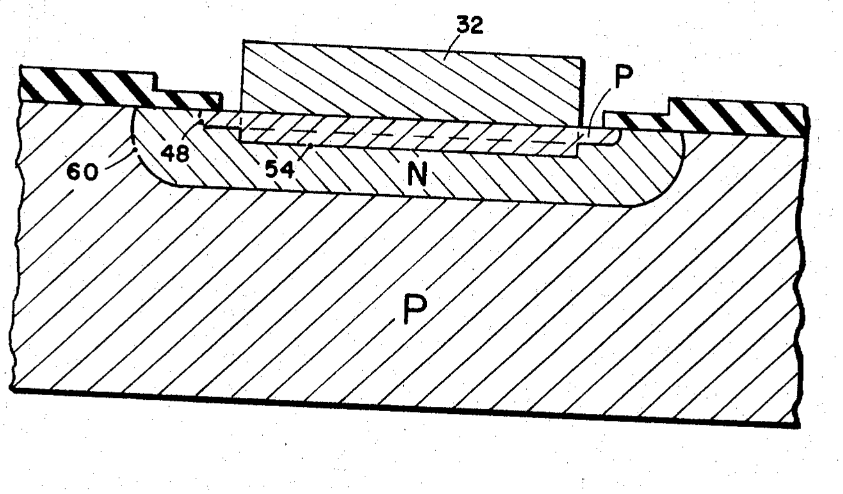

The method and device of this invention will be completely understood when the detailed specification is taken in conjunction with the drawings, wherein:

FIGS. 1(*a*)–1(*d*) are sectional views showing the formation of a solid state device at varying stages of its processing;

FIGS. 2(*a*)–2(*d*) are sectional views showing an alternate method of forming a solid state device in accordance with this invention; and FIG. 3 is a sectional view of a transistor structure employing the invention.

Referring to FIG. 1(*a*), a monocrystalline semiconductor wafer 10 is shown. This wafer 10 may typically be an N-type silicon material having an N-type dopant such as arsenic, antimony, or phosphorus added during crystal growth or subsequent thereto as is well known in the art. The invention is not limited to silicon semiconductor material, however. Other monocrystalline semiconductor materials, such as germanium and the III–V compounds, such as gallium arsenide or indium antimonide, may be employed. In fact, the invention is particularly advantageous when used in conjunction with III–V element technology. With the present status of the art, it is very difficult to obtain a highly doped emitter region in gallium arsenide. Conventional dopants, such as zinc, do not diffuse in sufficient concentrations to result in a heavily doped emitter region. Accordingly, the injection efficiency of the emitter in conventional diffused III–V transistors is not as high as would be desired. However, if the emitter is formed in accordance with the teachings of the subject invention, using an alloy emitter, the resulting devices have the low leakage currents of a planar structure, but additionally have the high emitter injection efficiency not heretofore possible with diffused III–V element transistors The wafer 10 has a flat surface 12 with a coating 14 formed over it to function as a mask and as a protective coating. The coating 14 may take the form of a layer of silicon oxide when the wafer 10 is silicon. This oxide coating 14 is commonly formed by placing the wafer 10 in an oxidizing environment for a controlled period of time and under selected temperature conditions. This procedure for oxide formation is discussed in U.S. Patent 3,108,359, issued to Gordon E. Moore and Robert N. Noyce on Oct. 29, 1963.

Following the formation of oxide 14, portions 18 are selectively removed by well known photoengraving techniques to expose the surface 12 so that the oxide 14 now forms a mask that may be used during the diffusion step of this invention. The wafer 10 as shown in FIG. 1(*a*) is ready for the diffusion step.

A diffusion step is next performed, resulting in the formation of an opposite or second conductivity type frame such as guard ring 20. In the case of an N-type conductivity wafer 10, the guard ring 20 is formed with a P-type dopant such as boron, indium or aluminum. The guard ring 20 has an inside dimension such as diameter 22, and an outside dimension such as diameter 26 that together form a first junction 28. The junction 28 is completely protected by the oxide coating 14 and is so protected during the entire processing and manufacture of the solid state device.

In a typical device, the guard ring 20 will have an inside diameter 22 of five mils, an outside diameter 26 of seven mils, and a depth of almost 6 microns. The diffusion may be accomplished by well known techniques such as those described in above-cited U.S. Patent 3,108,359. Other methods for accomplishing diffusion are discussed in the book "Microelectronics" edited by E. Keonjian, McGraw-Hill Book Co., Inc., in an article by Gordon E. Moore on pages 268–282 (1963). Following or during the diffusion step, oxide growth or reoxidation is instigated by maintaining an oxidizing atmosphere in the diffusion furnace, resulting in the regrowth oxide layer 30 being formed over the original oxide 14 and over the exposed part of the wafer 10. The combined steps of diffusing an impurity and forming an oxide layer, either simultaneously or after diffusion, is referred to in this specification as planar diffusing. The device at this state of the process is shown in **FIG. 1(*b*)**.

After the completion of the planar diffusion step, a portion of the regrowth oxide 30 is selectively removed by well known photoengraving techniques to expose a part of guard ring 20. Typically, a six mil oxide cut is made, exposing the inner diameter 22, the inner edge of junction 28, and part of guard ring 20, while the outer edge of the junction 28 remains protected, as shown. With the inner edge of junction 28 exposed at the surface of wafer 10, a metallic body, such as a dot of aluminum 32, is vacuum evaporated over at least a portion of the wafer from which the regrowth oxide 30 has been removed. With an N-type wafer, any conventional P-type alloy material may be used. Conversely, with a P-type wafer, any conventional N-type alloy material may be used. The dot of aluminum 32 bridges the guard ring 20 and contacts its entire circumference atop the inner edge of junction 28. Typically, this may be accomplished by covering the entire wafer with a layer of aluminum having a thickness of about eight microns. The excess aluminum is then stripped by a photoengraving operation from the wafer 10, leaving a 5.5 mil diameter dot of aluminum overlying the exposed portion of the wafer 10 and part of the guard ring 20. When alloying with other materials, the dot of alloy material may overlap the oxide layer 30. This is permissible as long as the material does not detrimentally react with the oxide layer when heated. Aluminum has been known to do this. The device resulting after this step of dot formation is shown in FIG. 1(*c*).

With the P-type guard band 20 formed by doping the wafer with boron, and the P-type (aluminum) dot 32 formed, only the final step of alloying is necessary to complete a junction formed in accordance with the invention. In the case of an aluminum dot 32, the alloying may be accomplished by heating the device to about 860° C. The aluminum dot 32 dissolves in the silicon wafer 10 and the guard ring 20 with very little lateral spreading. The device is then permitted to slowly cool and recrystallization takes place with an alloy junction 34 being formed beneath the surface 12 of the wafer 10 at a depth of about three microns. This alloy junction 34 intersects junction 28 and is substantially a continuation of junction 28 between wafer 10 and guard ring 20, forming a composite junction in combination with the junction 28. The device at this point in the process is shown in FIG. 1(*d*).

After the alloying process, the devices may be finished in the conventional manner, that is, contacts may be attached and packaging completed. The resulting device in the above example would be a PN junction diode. It is, of course, consistent with the invention to form any solid state device by this technique, such as transistors or integrated circuits.

It should be noted that the alloy portion 34 of the junction (FIG. 1(*d*)) is not and has not been exposed to the environment during its formation. Further, the alloy portion 34 has been formed entirely beneath the surface 12 of the wafer 10 since the alloy portion 34 and the diffused portion 28 of the junction meet below the surface of wafer 10, neither the remaining part of the diffused portion 28, nor the alloy portion 34 has ever been exposed during the formation of the device. Thus, the combined junction forms a composite junction that is completely protected from the environment during the manufacture of the device and thereafter. The formed composite junction may be characterized as an alloy junction. This is evidenced from the fact that the measured breakdown voltage of the diffused guard ring, which was partially exposed at the surface prior to the alloying step, ranged from 8 to 14 volts (with $i_r$=2 ma.). This is consistent with the fact that diffused structures seldom if ever have breakdown voltages under four volts. With the alloying material added, the breakdown voltage at $i_r$=2 ma. ranged from 2.98 volts to 3.34 volts. Thus, the final device has the characteristics of an alloy device with a lower breakdown voltage within a more precisely defined range. However, the device also has many of the advantages normally associated only with planar diffusion technology.

An alternate embodiment of the device and method is shown in FIGS. 2(*a*)–2(*d*). The same numerals utilized in FIG. 1 are used in FIG. 2 where applicable. This embodiment differs from the one shown in FIG. 1 in that it has a diffused structure which takes the form of a continuous circular or pan shaped region rather than a guard ring. This difference in structure is realized by removing a circular portion 40 of the oxide 14 formed on the wafer 10. This selective removal of the oxide exposes a circular area of the wafer 10 and enables the circular diffused region 42 (FIG. 4(*b*)) to be formed in the wafer 10 (FIG. 4(*a*)). The diffused region 42 may be formed as explained with regard to the first embodiment, having a conductivity type opposite to the conductivity type of wafer 10. The diffused region 42 forms a junction 48 with the wafer that is protected by the oxide coating 14 and the regrown oxide 30.

The remaining steps in the formation of this embodiment are substantially identical with those described with regard to the first embodiment. Briefly, after the diffusion step, the regrowth oxide 30 is selectively removed from a portion of the diffused region 42 by well known photoengraving techniques. This is followed by the formation of the dot 32, in accordance with the techniques described above. The structure is then heated to above 800° C., causing the dot 32 to dissolve both in the diffused region 42 immediately beneath the dot and in the portion of wafer 10 beneath the diffused region 42, as shown in FIG. 2(*d*). Upon slow cooling, recrystallization takes place with an alloy junction 54 being formed beneath the surface of the wafer 10. The alloy junction 54 is substantially continuous with the junction 48 of the diffused structure forming a composite junction similar to the one formed in the embodiment shown in FIG. 1. The finally formed junction is shown in FIG. 2(*d*). Typically, the diffused region would have a depth of 1.5 microns from the surface of the wafer 10 beneath the oxide coating, while the alloy junction would have a depth of 1.7 microns from the surface. The advantages attributed to this embodiment are substantially the same as attributed to the first embodiment.

Another embodiment of the invention is shown in FIG. 3. This embodiment involves the same PN junction shown in FIG. 2 and an additional PN junction 60. Thus the invention may be employed in a transistor structure or in conjunction with isolation regions. Briefly, this embodiment is formed by double planar diffusion of a body of one conductivity, followed by an alloying step. The alloying step may be performed as discussed with regard to FIG. 1 or 2.

In summary, the invented device includes a composite junction having a planar diffused portion and an alloy portion, but exhibiting characteristics which combine the advantages of both. The alloy junction is formed completely beneath the surface of the wafer and the edges of the diffused portion of the junction extending to the wafer surface are protected by a protective coating. The method of the invention comprises forming a diffused structure of one conductivity type in a monocrystalline wafer of an opposite conductivity type with a junction extending to the surface of the wafer. A protective coating is formed over the wafer, exposing a portion of the diffused structure and covering at least a portion of the upper edges of the junction. The exposed portion of the wafer is then alloyed with a material having the same conductivity type as the diffused structure, resulting in the formation of an alloyed junction below the surface of the wafer, which is a continuous extension of the junction formed by the diffused structure.

The above method has the advantage of forming an alloy device or junction consistent with the advantages of the planar technology. Further, the method has a high yield of useful devices that may be manufactured to precise specifications. The invented device exhibits characteristics substantially the same as an alloy device, but with the high reliability normally associated only with the planar process.

It will be understood that the invention in its broader aspects is not limited to the specific embodiments described above.

What is claimed is:

1. A semiconductor device comprising: a body of monocrystalline semiconductor material having a surface; a first region of a first conductivity type located within said body and extending to said surface; a second region of opposite conductivity type located within said first region to form a first PN junction that extends to said surface; a protective coating grown over at least a portion of said first PN junction; and alloy material of said opposite conductivity type dissolved in said second region and forming beneath said surface an alloy junction with said first region.

2. A semiconductor device comprising: monocrystalline body of semiconductor material of a first conductivity type having a flat surface; a diffused region of opposite conductivity type located within said body and having a frame-like shape that forms a first PN junction extending to said surface with an outside and inside dimension at said surface; a protective coating over at least the surface of said outside dimension of said first PN junction at said surface; a protective coating over at least the surface of said outside dimension of said first PN junction at said surface; and alloy material of opposite conductivity type bridging said frame-like shape, said alloy material dissolved in said body and said diffused region to form an alloy junction with said body, said alloy junction beneath said flat surface and continuous with said inside dimension of said first PN junction extending to said surface, whereby said alloy junction is not exposed to environmental conditions.

3. In a semiconductor structure a PN junction comprising: a monocrystalline body of semiconductor material of a first conductivity type having a flat surface; a protective coating over at least a part of said flat surface; a pan-shaped diffused region of an opposite conductivity type within said body and forming a first junction that extends to said flat surface under said protective coating; and an alloy material of the same conductivity type as said diffused region dissolved therein and in said body to form an alloy junction with said body, said alloy junction formed beneath said flat surface and continuous with said first junction to comprise a single PN junction, whereby the semiconductor structure incorporates an alloy PN junction beneath said protective coating and said flat surface.

4. A method for forming a PN junction in a solid state device that includes a monocrystalline semiconductor body of one conductivity type with a surface, the steps comprising: forming a diffused region within said body having a conductivity type opposite to that of said body and forming a PN junction therewith extending to the surface of said body; forming a protective coating over at least a part of the junction where it extends to the surface of the body, said coating formed to expose a portion of the diffused region; and alloying the exposed portion of the diffused region and the body with a material having the same conductivity type as the diffused region to form an alloy junction with said wafer below said wafer surface.

5. In a method for forming a solid state device, which includes a monocrystalline semiconductor wafer of one conductivity type with a surface, the steps comprising: planar diffusing a region of conductivity type opposite to that of said wafer to form a junction extending to the surface of said wafer and covered by an oxide; removing a portion of the oxide formed during the planar diffusing to expose a portion of the diffused region; and alloying the exposed portion of the diffused region and said wafer with a material having the same conductivity type as the diffused region to form an alloy junction below the surface of the wafer.

6. A method for forming a solid state device, in a monocrystalline semiconductor body of one conductivity type with a surface comprising: planar diffusing a guard ring of conductivity type opposite to that of the body with a junction having an inner and outer dimension extending to the surface of the body and covered by an oxide layer; removing a portion of the oxide layer formed during planar diffusing to expose at least a portion of the guard ring, the inside dimension of the junction at said surface, and the surface of the body within said inside dimension; and alloying the exposed portion of the guard ring, junction and body with a material having the same conductivity type as the guard ring to form an alloy junction with the body, whereby a composite junction is formed including the outside dimension of the diffused junction and the alloy junction, which junction exhibits substantially the same characteristics as an alloy junction.

7. A method for forming a solid state device, which includes a monocrystalline semiconductor body of one conductivity type having a surface, the steps comprising: planar diffusing a region of conductivity type opposite to the conductivity type of said body to form a junction extending to the surface; removing a portion of the oxide formed during the diffusing to expose a portion of the diffused region; and alloying the exposed portion of the diffused region and the body with a material having the same conductivity type as the diffused region to form an alloy junction with said body below the surface.

8. In a method for forming a solid state device, including a monocrystalline semiconductor body of one conductivity type, the steps comprising: planar diffusing a pan-shaped region of conductivity type opposite to the body with a PN junction formed therebetween extending to the surface of the body covered with an oxide layer; removing a portion of the oxide layer to expose a portion of the pan-shaped region but leaving the oxide layer formed over the junction where same extends to said surface; and alloying over the exposed portion of the diffused region with a material having the same conductivity type as the region to form an alloy junction with the material of said body, whereby a composite junction is formed including the diffused junction and the alloy junction, which junction exhibits substantially the same characteristics as an alloy junction.

9. In a semiconductor device including a monocrystalline semiconductor wafer having a surface, the combination comprising a diffused junction that extends to the surface of said wafer, a protective coating protecting said junction from the environment, and an alloy junction substantially continuous with said diffused junction and beneath the surface of said wafer.

References Cited

UNITED STATES PATENTS

| | | | |
|---|---|---|---|
| 2,843,511 | 7/1958 | Pankove | 148—186 |
| 3,218,525 | 11/1965 | Moore et al. | 148—33 |
| 3,226,613 | 12/1965 | Haenichen | 148—33 |
| 3,275,910 | 9/1966 | Phillips | 148—33 |

DAVID L. RECK, *Primary Examiner.*

RICHARD O. DEAN, *Examiner.*